United States Patent
Lesher et al.

(10) Patent No.: US 7,295,025 B2
(45) Date of Patent: *Nov. 13, 2007

(54) PROBE STATION WITH LOW NOISE CHARACTERISTICS

(75) Inventors: Timothy Lesher, Portland, OR (US); Brad Miller, Portland, OR (US); Clarence E. Cowan, Newberg, OR (US); Michael Simmons, Colton, OR (US); Frank Gray, Beaverton, OR (US); Cynthia L. McDonald, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/528,809

(22) Filed: Sep. 27, 2006

(65) Prior Publication Data

US 2007/0018665 A1    Jan. 25, 2007

Related U.S. Application Data

(63) Continuation of application No. 10/986,639, filed on Nov. 12, 2004, now Pat. No. 7,138,810, which is a continuation of application No. 10/666,219, filed on Sep. 18, 2003, now Pat. No. 6,847,219.

(60) Provisional application No. 60/424,986, filed on Nov. 8, 2002.

(51) Int. Cl.
*G01R 31/02* (2006.01)
(52) U.S. Cl. .......................... 324/754; 174/36
(58) Field of Classification Search ........ 324/754–755, 324/761–762, 454, 72.5, 71.1; 174/32–36; 333/243; 439/275
See application file for complete search history.

(56) References Cited

U.S. PATENT DOCUMENTS 1,337,866 A     4/1920  Whitaker (Continued)

FOREIGN PATENT DOCUMENTS

DE     29 12 826     10/1980

(Continued)

OTHER PUBLICATIONS

Christophe Risacher, Vessen Vassilev, Alexey Pavolotsky, and Victor Belitsky, "Waveguide-to-Microstrip Transition With Integrated Bias-T" IEEE Microwave and Wirelss Components Letters, vol. 13, No. 7, Jul. 2003, pp. 262-264.

(Continued)

*Primary Examiner*—Vinh P. Nguyen
(74) *Attorney, Agent, or Firm*—Chernoff, Vilhauer, McClung & Stenzel

(57) ABSTRACT

A cable includes an inner conductor, an inner dielectric, and a guard conductor, where the inner dielectric is between the inner conductor and the guard conductor. The cable also includes an outer dielectric, and a shield conductor, where the outer dielectric is between the guard conductor and the shield conductor. The cable further includes an additional layer of material between the outer dielectric and the shield conductor of suitable composition for reducing triboelectric current generation between the outer dielectric and the shield conductor to less than that which would occur were the outer dielectric and the shield conductor to directly adjoin each other.

8 Claims, 4 Drawing Sheets

U.S. PATENT DOCUMENTS

| | | |
|---|---|---|
| 2,142,625 A | 1/1939 | Zoethout |
| 2,197,081 A | 4/1940 | Piron |
| 2,376,101 A | 5/1945 | Tyzzer |
| 2,389,668 A | 11/1945 | Johnson |
| 2,471,897 A | 5/1949 | Rappl |
| 2,812,502 A | 11/1957 | Doherty |
| 3,176,091 A | 3/1965 | Hanson et al. |
| 3,185,927 A | 5/1965 | Margulis et al. |
| 3,192,844 A | 7/1965 | Szasz et al. |
| 3,193,712 A | 7/1965 | Harris |
| 3,201,721 A | 8/1965 | Voelcker |
| 3,230,299 A | 1/1966 | Radzlejowski |
| 3,256,484 A | 6/1966 | Terry |
| 3,265,969 A | 8/1966 | Catu |
| 3,289,046 A | 11/1966 | Carr |
| 3,333,274 A | 7/1967 | Forcier |
| 3,405,361 A | 10/1968 | Kattner et al. |
| 3,408,565 A | 10/1968 | Frick et al. |
| 3,435,185 A | 3/1969 | Gerard |
| 3,484,679 A | 12/1969 | Hodgson et al. |
| 3,596,228 A | 7/1971 | Reed, Jr. et al. |
| 3,602,845 A | 8/1971 | Agrios et al. |
| 3,609,539 A | 9/1971 | Gunthert |
| 3,648,169 A | 3/1972 | Wiesler |
| 3,654,573 A | 4/1972 | Graham |
| 3,662,316 A | 5/1972 | Decuyper |
| 3,710,251 A | 1/1973 | Hagge et al. |
| 3,714,572 A | 1/1973 | Ham et al. |
| 3,775,644 A | 11/1973 | Cotner et al. |
| 3,777,260 A | 12/1973 | Davies et al. |
| 3,810,017 A | 5/1974 | Wiesler et al. |
| 3,814,888 A | 6/1974 | Bowers et al. |
| 3,829,076 A | 8/1974 | Sofy |
| 3,863,181 A | 1/1975 | Glance et al. |
| 3,866,093 A | 2/1975 | Kusters et al. |
| 3,930,809 A | 1/1976 | Evans |
| 3,936,743 A | 2/1976 | Roch |
| 3,970,934 A | 7/1976 | Aksu |
| 3,996,517 A | 12/1976 | Fergason et al. |
| 4,001,685 A | 1/1977 | Roch |
| 4,008,900 A | 2/1977 | Khoshaba |
| 4,009,456 A | 2/1977 | Hopfer |
| 4,027,253 A | 5/1977 | Chiron et al. |
| 4,035,723 A | 7/1977 | Kvaternik |
| 4,038,894 A | 8/1977 | Knibbe et al. |
| 4,042,119 A | 8/1977 | Hassan et al. |
| 4,049,252 A | 9/1977 | Bell |
| 4,066,943 A | 1/1978 | Roch |
| 4,093,988 A | 6/1978 | Scott |
| 4,099,120 A | 7/1978 | Aksu |
| 4,115,735 A | 9/1978 | Stanford |
| 4,115,736 A | 9/1978 | Tracy |
| 4,116,523 A | 9/1978 | Coberly et al. |
| 4,151,465 A | 4/1979 | Lenz |
| 4,161,692 A | 7/1979 | Tarzwell |
| 4,172,993 A | 10/1979 | Leach |
| 4,186,338 A | 1/1980 | Fichtenbaum |
| 4,275,446 A | 6/1981 | Blaess |
| 4,280,112 A | 7/1981 | Eisenhart |
| 4,284,033 A | 8/1981 | delRio |
| 4,284,682 A | 8/1981 | Frosch et al. |
| 4,287,473 A | 9/1981 | Sawyer |
| 4,342,958 A | 8/1982 | Russell |
| 4,346,355 A | 8/1982 | Tsukii |
| 4,352,061 A | 9/1982 | Matrone |
| 4,357,575 A | 11/1982 | Uren et al. |
| 4,365,109 A | 12/1982 | O'Loughlin |
| 4,365,195 A | 12/1982 | Stegens |
| 4,371,742 A | 2/1983 | Manly |
| 4,376,920 A | 3/1983 | Smith |
| 4,383,178 A | 5/1983 | Shibata et al. |
| 4,414,638 A | 11/1983 | Talambiras |
| 4,419,626 A | 12/1983 | Cedrone et al. |
| 4,425,395 A | 1/1984 | Negishi et al. |
| 4,426,619 A | 1/1984 | Demand |
| 4,473,798 A | 9/1984 | Cedrone et al. |
| 4,479,690 A | 10/1984 | Inouye et al. |
| 4,480,223 A | 10/1984 | Aigo |
| 4,487,996 A | 12/1984 | Rabinowitz et al. |
| 4,491,173 A | 1/1985 | Demand |
| 4,503,335 A | 3/1985 | Takahashi |
| 4,507,602 A | 3/1985 | Aguirre |
| 4,528,504 A | 7/1985 | Thornton, Jr. et al. |
| 4,531,474 A | 7/1985 | Inuta |
| 4,532,423 A | 7/1985 | Tojo et al. |
| 4,557,599 A | 12/1985 | Zimring |
| 4,566,184 A | 1/1986 | Higgins et al. |
| 4,567,321 A | 1/1986 | Harayama |
| 4,567,908 A | 2/1986 | Bolsterli |
| 4,575,676 A | 3/1986 | Palkuti |
| 4,586,970 A | 5/1986 | Donecker et al. |
| 4,621,169 A | 11/1986 | Petinelli et al. |
| 4,626,618 A | 12/1986 | Takaoka et al. |
| 4,642,417 A | 2/1987 | Ruthrof et al. |
| 4,646,005 A | 2/1987 | Ryan |
| 4,665,360 A | 5/1987 | Phillips |
| 4,673,839 A | 6/1987 | Veenendaal |
| 4,675,600 A | 6/1987 | Gergin |
| 4,680,538 A | 7/1987 | Dalman et al. |
| 4,684,883 A | 8/1987 | Ackerman et al. |
| 4,691,831 A | 9/1987 | Suzuki et al. |
| 4,694,245 A | 9/1987 | Frommes |
| 4,695,794 A | 9/1987 | Bargett et al. |
| 4,697,143 A | 9/1987 | Lockwood et al. |
| 4,703,433 A | 10/1987 | Sharrit |
| 4,711,563 A | 12/1987 | Lass |
| 4,712,370 A | 12/1987 | MacGee |
| 4,727,637 A | 3/1988 | Buckwitz et al. |
| 4,730,158 A | 3/1988 | Kasai et al. |
| 4,731,577 A | 3/1988 | Logan |
| 4,734,872 A | 3/1988 | Eager et al. |
| 4,739,259 A | 4/1988 | Hadwin et al. |
| 4,744,041 A | 5/1988 | Strunk et al. |
| 4,755,746 A | 7/1988 | Mallory et al. |
| 4,755,874 A | 7/1988 | Esrig et al. |
| 4,757,255 A | 7/1988 | Margozzi |
| 4,758,785 A | 7/1988 | Rath |
| 4,759,712 A | 7/1988 | Demand |
| 4,771,234 A | 9/1988 | Cook et al. |
| 4,772,846 A | 9/1988 | Reeds |
| 4,777,434 A | 10/1988 | Miller et al. |
| 4,783,625 A | 11/1988 | Harry et al. |
| 4,784,213 A | 11/1988 | Eager et al. |
| 4,786,867 A | 11/1988 | Yamatsu |
| 4,787,752 A | 11/1988 | Fraser et al. |
| 4,791,363 A | 12/1988 | Logan |
| 4,810,981 A | 3/1989 | Herstein |
| 4,812,754 A | 3/1989 | Tracy et al. |
| 4,816,767 A | 3/1989 | Cannon et al. |
| 4,818,169 A | 4/1989 | Schram et al. |
| 4,827,211 A | 5/1989 | Strid et al. |
| 4,838,802 A | 6/1989 | Soar |
| 4,839,587 A | 6/1989 | Flatley et al. |
| 4,845,426 A | 7/1989 | Nolan et al. |
| 4,849,689 A | 7/1989 | Gleason et al. |
| 4,853,613 A | 8/1989 | Sequeira et al. |
| 4,856,426 A | 8/1989 | Wirz |
| 4,856,904 A | 8/1989 | Akagawa |
| 4,858,160 A | 8/1989 | Strid et al. |
| 4,859,989 A | 8/1989 | McPherson |
| 4,871,883 A | 10/1989 | Guiol |
| 4,871,965 A | 10/1989 | Elbert et al. |
| 4,884,026 A | 11/1989 | Hayakawa et al. |
| 4,884,206 A | 11/1989 | Mate |

| Patent No. | Date | Inventor |
|---|---|---|
| 4,888,550 A | 12/1989 | Reid |
| 4,893,914 A | 1/1990 | Hancock et al. |
| 4,894,612 A | 1/1990 | Drake et al. |
| 4,896,109 A | 1/1990 | Rauscher |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,916,398 A | 4/1990 | Rath |
| 4,918,279 A | 4/1990 | Babel et al. |
| 4,918,374 A | 4/1990 | Stewart et al. |
| 4,923,407 A | 5/1990 | Rice et al. |
| 4,926,118 A | 5/1990 | O'Connor et al. |
| 4,933,634 A | 6/1990 | Cuzin et al. |
| 4,968,931 A | 11/1990 | Littlebury et al. |
| 4,978,907 A | 12/1990 | Smith |
| 4,978,914 A | 12/1990 | Akimoto et al. |
| 4,982,153 A | 1/1991 | Collins et al. |
| 4,994,737 A | 2/1991 | Carlton et al. |
| 5,001,423 A | 3/1991 | Abrami et al. |
| 5,006,796 A | 4/1991 | Burton et al. |
| 5,010,296 A | 4/1991 | Okada et al. |
| 5,030,907 A | 7/1991 | Yih et al. |
| 5,034,688 A | 7/1991 | Moulene et al. |
| 5,041,782 A | 8/1991 | Marzan |
| 5,045,781 A | 9/1991 | Gleason et al. |
| 5,061,823 A | 10/1991 | Carroll |
| 5,065,089 A | 11/1991 | Rich |
| 5,065,092 A | 11/1991 | Sigler |
| 5,066,357 A | 11/1991 | Smyth, Jr. et al. |
| 5,070,297 A | 12/1991 | Kwon et al. |
| 5,077,523 A | 12/1991 | Blanz |
| 5,084,671 A | 1/1992 | Miyata et al. |
| 5,089,774 A | 2/1992 | Nakano |
| 5,091,691 A | 2/1992 | Kamieniecki et al. |
| 5,091,692 A | 2/1992 | Ohno et al. |
| 5,095,891 A | 3/1992 | Reitter |
| 5,097,207 A | 3/1992 | Blanz |
| 5,101,149 A | 3/1992 | Adams et al. |
| 5,101,453 A | 3/1992 | Rumbaugh |
| 5,103,169 A | 4/1992 | Heaton et al. |
| 5,105,148 A | 4/1992 | Lee |
| 5,105,181 A | 4/1992 | Ross |
| 5,107,076 A | 4/1992 | Bullock et al. |
| 5,142,224 A | 8/1992 | Smith et al. |
| 5,144,228 A | 9/1992 | Sorna et al. |
| 5,159,752 A | 11/1992 | Mahant-Shetti et al. |
| 5,160,883 A | 11/1992 | Blanz |
| 5,164,661 A | 11/1992 | Jones |
| 5,166,606 A | 11/1992 | Blanz |
| 5,172,049 A | 12/1992 | Kiyokawa et al. |
| 5,198,752 A | 3/1993 | Miyata et al. |
| 5,198,753 A | 3/1993 | Hamburgen |
| 5,198,756 A | 3/1993 | Jenkins et al. |
| 5,198,758 A | 3/1993 | Iknaian et al. |
| 5,202,558 A | 4/1993 | Barker |
| 5,209,088 A | 5/1993 | Vaks |
| 5,210,485 A | 5/1993 | Kreiger et al. |
| 5,214,243 A | 5/1993 | Johnson |
| 5,214,374 A | 5/1993 | St. Onge |
| 5,218,185 A | 6/1993 | Gross |
| 5,220,277 A | 6/1993 | Reitinger |
| 5,221,905 A | 6/1993 | Bhangu et al. |
| 5,225,037 A | 7/1993 | Elder et al. |
| 5,225,796 A | 7/1993 | Williams et al. |
| 5,237,267 A | 8/1993 | Harwood et al. |
| 5,266,889 A | 11/1993 | Harwood et al. |
| 5,278,494 A | 1/1994 | Obigane |
| 5,280,156 A | 1/1994 | Niori et al. |
| 5,303,938 A | 4/1994 | Miller et al. |
| 5,315,237 A | 5/1994 | Iwakura et al. |
| 5,321,352 A | 6/1994 | Takebuchi |
| 5,325,052 A | 6/1994 | Yamashita |
| 5,334,931 A | 8/1994 | Clarke et al. |
| 5,336,989 A | 8/1994 | Hofer |
| 5,345,170 A | 9/1994 | Schwindt et al. |
| 5,369,370 A | 11/1994 | Stratmann et al. |
| 5,371,457 A | 12/1994 | Lipp |
| 5,373,231 A | 12/1994 | Boll et al. |
| 5,382,898 A | 1/1995 | Subramanian |
| 5,397,855 A | 3/1995 | Ferlier |
| 5,404,111 A | 4/1995 | Mori et al. |
| 5,408,189 A | 4/1995 | Swart et al. |
| 5,410,259 A | 4/1995 | Fujihara et al. |
| 5,422,574 A | 6/1995 | Kister |
| 5,434,512 A | 7/1995 | Schwindt et al. |
| 5,448,172 A * | 9/1995 | Dechene et al. ............. 324/454 |
| 5,451,884 A | 9/1995 | Sauerland |
| 5,457,398 A | 10/1995 | Schwindt et al. |
| 5,461,328 A | 10/1995 | Devereaux et al. |
| 5,469,324 A | 11/1995 | Henderson et al. |
| 5,475,316 A | 12/1995 | Hurley et al. |
| 5,477,011 A | 12/1995 | Singles et al. |
| 5,479,108 A | 12/1995 | Cheng |
| 5,479,109 A | 12/1995 | Lau et al. |
| 5,481,936 A | 1/1996 | Yanagisawa |
| 5,486,975 A | 1/1996 | Shamouilian et al. |
| 5,488,954 A | 2/1996 | Sleva et al. |
| 5,491,426 A | 2/1996 | Small |
| 5,493,070 A | 2/1996 | Habu |
| 5,493,236 A | 2/1996 | Ishii et al. |
| 5,500,606 A | 3/1996 | Holmes |
| 5,506,515 A | 4/1996 | Godshalk et al. |
| 5,508,631 A | 4/1996 | Manku et al. |
| 5,510,792 A | 4/1996 | Ono et al. |
| 5,511,010 A | 4/1996 | Burns |
| 5,515,167 A | 5/1996 | Ledger et al. |
| 5,517,111 A | 5/1996 | Shelor |
| 5,521,522 A | 5/1996 | Abe et al. |
| 5,523,694 A | 6/1996 | Cole, Jr. |
| 5,530,371 A | 6/1996 | Perry et al. |
| 5,530,372 A | 6/1996 | Lee et al. |
| 5,532,609 A | 7/1996 | Harwood et al. |
| 5,539,323 A | 7/1996 | Davis, Jr. |
| 5,546,012 A | 8/1996 | Perry et al. |
| 5,550,480 A | 8/1996 | Nelson et al. |
| 5,550,482 A | 8/1996 | Sano |
| 5,552,716 A | 9/1996 | Takahashi et al. |
| 5,554,236 A * | 9/1996 | Singles et al. ................ 156/52 |
| 5,561,377 A | 10/1996 | Strid et al. |
| 5,561,585 A | 10/1996 | Barnes et al. |
| 5,565,788 A | 10/1996 | Burr et al. |
| 5,571,324 A | 11/1996 | Sago et al. |
| 5,572,398 A | 11/1996 | Federlin et al. |
| 5,583,445 A | 12/1996 | Mullen |
| 5,594,358 A | 1/1997 | Ishikawa et al. |
| 5,604,444 A | 2/1997 | Harwood et al. |
| 5,610,529 A | 3/1997 | Schwindt |
| 5,611,946 A | 3/1997 | Leong et al. |
| 5,617,035 A | 4/1997 | Swapp |
| 5,629,631 A | 5/1997 | Perry et al. |
| 5,631,571 A | 5/1997 | Spaziani et al. |
| 5,640,101 A | 6/1997 | Kuji et al. |
| 5,646,538 A | 7/1997 | Lide et al. |
| 5,657,394 A | 8/1997 | Schwartz et al. |
| 5,659,255 A | 8/1997 | Strid et al. |
| 5,663,653 A | 9/1997 | Schwindt et al. |
| 5,666,063 A | 9/1997 | Abercrombie et al. |
| 5,668,470 A | 9/1997 | Shelor |
| 5,669,316 A | 9/1997 | Faz et al. |
| 5,670,888 A | 9/1997 | Cheng |
| 5,675,499 A | 10/1997 | Lee et al. |
| 5,675,932 A | 10/1997 | Mauney |
| 5,676,360 A | 10/1997 | Boucher et al. |
| 5,680,039 A | 10/1997 | Mochizuki et al. |
| 5,682,337 A | 10/1997 | El-Fishawy et al. |

| Patent No. | Date | Inventor |
|---|---|---|
| 5,685,232 A | 11/1997 | Inoue |
| 5,712,571 A | 1/1998 | O'Donoghue |
| 5,729,150 A | 3/1998 | Schwindt |
| 5,731,708 A | 3/1998 | Sobhani |
| 5,773,951 A | 6/1998 | Markowski et al. |
| 5,777,485 A | 7/1998 | Tanaka et al. |
| 5,798,652 A | 8/1998 | Taraci |
| 5,802,856 A | 9/1998 | Schaper et al. |
| 5,804,982 A | 9/1998 | Lo et al. |
| 5,804,983 A | 9/1998 | Nakajima et al. |
| 5,807,107 A | 9/1998 | Bright et al. |
| 5,811,751 A | 9/1998 | Leong et al. |
| 5,828,225 A | 10/1998 | Obikane et al. |
| 5,831,442 A | 11/1998 | Heigl |
| 5,835,997 A | 11/1998 | Yassine |
| 5,838,161 A | 11/1998 | Akram et al. |
| 5,847,569 A | 12/1998 | Ho et al. |
| 5,848,500 A | 12/1998 | Kirk |
| 5,857,667 A | 1/1999 | Lee |
| 5,861,743 A | 1/1999 | Pye et al. |
| 5,869,975 A | 2/1999 | Strid et al. |
| 5,874,361 A | 2/1999 | Collins et al. |
| 5,879,289 A | 3/1999 | Yarush et al. |
| 5,883,522 A | 3/1999 | O'Boyle |
| 5,883,523 A | 3/1999 | Ferland et al. |
| 5,892,539 A | 4/1999 | Colvin |
| 5,900,737 A | 5/1999 | Graham et al. |
| 5,903,143 A | 5/1999 | Mochizuki et al. |
| 5,910,727 A | 6/1999 | Fujihara et al. |
| 5,916,689 A | 6/1999 | Collins et al. |
| 5,923,177 A | 7/1999 | Wardwell |
| 5,926,028 A | 7/1999 | Mochizuki |
| 5,942,907 A | 8/1999 | Chiang |
| 5,945,836 A | 8/1999 | Sayre et al. |
| 5,949,579 A | 9/1999 | Baker |
| 5,952,842 A | 9/1999 | Fujimoto |
| 5,959,461 A | 9/1999 | Brown et al. |
| 5,960,411 A | 9/1999 | Hartman et al. |
| 5,963,027 A | 10/1999 | Peters |
| 5,963,364 A | 10/1999 | Leong et al. |
| 5,973,505 A | 10/1999 | Strid et al. |
| 5,982,166 A | 11/1999 | Mautz |
| 5,995,914 A | 11/1999 | Cabot |
| 5,998,768 A | 12/1999 | Hunter et al. |
| 5,999,268 A | 12/1999 | Yonezawa et al. |
| 6,001,760 A | 12/1999 | Katsuda et al. |
| 6,002,236 A | 12/1999 | Trant et al. |
| 6,002,263 A | 12/1999 | Peters et al. |
| 6,002,426 A | 12/1999 | Back et al. |
| 6,013,586 A | 1/2000 | McGhee et al. |
| 6,023,209 A | 2/2000 | Faulkner et al. |
| 6,028,435 A | 2/2000 | Nikawa |
| 6,029,141 A | 2/2000 | Bezos et al. |
| 6,031,383 A | 2/2000 | Streib et al. |
| 6,034,533 A | 3/2000 | Tervo et al. |
| 6,037,785 A | 3/2000 | Higgins |
| 6,037,793 A | 3/2000 | Miyazawa et al. |
| 6,043,667 A | 3/2000 | Cadwallader et al. |
| 6,049,216 A | 4/2000 | Yang et al. |
| 6,052,653 A | 4/2000 | Mazur et al. |
| 6,054,869 A | 4/2000 | Hutton et al. |
| 6,060,888 A | 5/2000 | Blackham et al. |
| 6,060,891 A | 5/2000 | Hembree et al. |
| 6,078,183 A | 6/2000 | Cole, Jr. |
| 6,091,236 A | 7/2000 | Piety et al. |
| 6,091,255 A | 7/2000 | Godfrey |
| 6,096,567 A | 8/2000 | Kaplan et al. |
| 6,104,203 A | 8/2000 | Costello et al. |
| 6,111,419 A | 8/2000 | Lefever et al. |
| 6,114,865 A | 9/2000 | Lagowski et al. |
| 6,118,894 A | 9/2000 | Schwartz et al. |
| 6,121,783 A | 9/2000 | Horner et al. |
| 6,124,723 A | 9/2000 | Costello |
| 6,124,725 A | 9/2000 | Sato |
| 6,127,831 A | 10/2000 | Khoury et al. |
| 6,130,544 A | 10/2000 | Strid et al. |
| 6,137,302 A | 10/2000 | Schwindt |
| 6,137,303 A | 10/2000 | Deckert et al. |
| 6,144,212 A | 11/2000 | Mizuta |
| 6,147,851 A | 11/2000 | Anderson |
| 6,160,407 A | 12/2000 | Nikawa |
| 6,194,907 B1 | 2/2001 | Kanao et al. |
| 6,198,299 B1 | 3/2001 | Hollman |
| 6,211,663 B1 | 4/2001 | Moulthrop et al. |
| 6,222,970 B1 | 4/2001 | Wach et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,232,790 B1 | 5/2001 | Bryan et al. |
| 6,236,975 B1 | 5/2001 | Boe et al. |
| 6,236,977 B1 | 5/2001 | Verba et al. |
| 6,245,692 B1 | 6/2001 | Pearce et al. |
| 6,252,392 B1 | 6/2001 | Peters |
| 6,257,319 B1 | 7/2001 | Kainuma et al. |
| 6,259,261 B1 | 7/2001 | Engelking et al. |
| 6,271,673 B1 | 8/2001 | Furuta et al. |
| 6,284,971 B1 | 9/2001 | Atalar et al. |
| 6,288,557 B1 | 9/2001 | Peters et al. |
| 6,292,760 B1 | 9/2001 | Burns |
| 6,300,775 B1 | 10/2001 | Peach et al. |
| 6,310,755 B1 | 10/2001 | Kholodenko et al. |
| 6,313,649 B2 | 11/2001 | Harwood et al. |
| 6,320,372 B1 | 11/2001 | Keller |
| 6,320,396 B1 | 11/2001 | Nikawa |
| 6,335,628 B2 | 1/2002 | Schwindt et al. |
| 6,362,636 B1 | 3/2002 | Peters et al. |
| 6,380,751 B2 | 4/2002 | Harwood et al. |
| 6,396,296 B1 | 5/2002 | Tarter et al. |
| 6,407,560 B1 | 6/2002 | Walraven et al. |
| 6,424,141 B1 | 7/2002 | Hollman et al. |
| 6,445,202 B1 | 9/2002 | Cowan et al. |
| 6,480,013 B1 | 11/2002 | Nayler et al. |
| 6,483,327 B1 | 11/2002 | Bruce et al. |
| 6,483,336 B1 | 11/2002 | Harris et al. |
| 6,486,687 B2 | 11/2002 | Harwood et al. |
| 6,488,405 B1 | 12/2002 | Eppes et al. |
| 6,489,789 B2 | 12/2002 | Peters et al. |
| 6,492,822 B2 | 12/2002 | Schwindt et al. |
| 6,501,289 B1 | 12/2002 | Takekoshi |
| 6,515,494 B1 | 2/2003 | Low |
| 6,549,022 B1 | 4/2003 | Cole, Jr. et al. |
| 6,549,026 B1 | 4/2003 | DiBattista et al. |
| 6,549,106 B2 | 4/2003 | Martin |
| 6,573,702 B2 | 6/2003 | Marcuse et al. |
| 6,605,951 B1 | 8/2003 | Cowan |
| 6,605,955 B1 | 8/2003 | Costello et al. |
| 6,608,494 B1 | 8/2003 | Bruce et al. |
| 6,608,496 B1 | 8/2003 | Strid et al. |
| 6,617,862 B1 | 9/2003 | Bruce |
| 6,621,082 B2 | 9/2003 | Morita et al. |
| 6,624,891 B2 | 9/2003 | Marcus et al. |
| 6,633,174 B1 | 10/2003 | Satya et al. |
| 6,636,059 B2 | 10/2003 | Harwood et al. |
| 6,639,415 B2 | 10/2003 | Peters et al. |
| 6,642,732 B2 | 11/2003 | Cowan et al. |
| 6,643,597 B1 | 11/2003 | Dunsmore |
| 6,686,753 B1 | 2/2004 | Kitahata |
| 6,701,265 B2 | 3/2004 | Hill et al. |
| 6,710,798 B1 | 3/2004 | Hershel et al. |
| 6,720,782 B2 | 4/2004 | Schwindt et al. |
| 6,724,205 B1 | 4/2004 | Hayden et al. |
| 6,724,928 B1 | 4/2004 | Davis |
| 6,734,687 B1 | 5/2004 | Ishitani et al. |
| 6,744,268 B2 | 6/2004 | Hollman |
| 6,771,090 B2 | 8/2004 | Harris et al. |
| 6,771,806 B1 | 8/2004 | Satya et al. |

| | | |
|---|---|---|
| 6,774,651 B1 | 8/2004 | Hembree |
| 6,777,964 B2 | 8/2004 | Navratil et al. |
| 6,788,093 B2 | 9/2004 | Aitren et al. |
| 6,791,344 B2 | 9/2004 | Cook et al. |
| 6,801,047 B2 | 10/2004 | Harwood et al. |
| 6,806,724 B2 | 10/2004 | Hayden et al. |
| 6,836,135 B2 | 12/2004 | Harris et al. |
| 6,838,885 B2 | 1/2005 | Kamitani |
| 6,842,024 B2 | 1/2005 | Peters et al. |
| 6,843,024 B2 | 1/2005 | Nozaki et al. |
| 6,847,219 B1 * | 1/2005 | Lesher et al. ............... 324/754 |
| 6,856,129 B2 | 2/2005 | Thomas et al. |
| 6,861,856 B2 | 3/2005 | Dunklee et al. |
| 6,873,167 B2 | 3/2005 | Goto et al. |
| 6,885,197 B2 | 4/2005 | Harris et al. |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,941 B2 | 6/2005 | Sun |
| 6,903,563 B2 | 6/2005 | Yoshida et al. |
| 6,927,079 B1 | 8/2005 | Fyfield |
| 6,992,495 B2 * | 1/2006 | Root et al. .................. 324/754 |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekleiv et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,229 B2 | 4/2006 | Maesaki et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,101,797 B2 | 9/2006 | Yuasa |
| 2001/0009377 A1 | 7/2001 | Schwindt et al. |
| 2001/0010468 A1 | 8/2001 | Gleason et al. |
| 2001/0020283 A1 | 9/2001 | Sakaguchi |
| 2001/0030549 A1 | 10/2001 | Gleason et al. |
| 2002/0075027 A1 | 6/2002 | Hollman et al. |
| 2002/0118009 A1 | 8/2002 | Hollman et al. |
| 2003/0062915 A1 | 4/2003 | Arnold et al. |
| 2003/0071631 A1 | 4/2003 | Alexander |
| 2003/0141861 A1 | 7/2003 | Navratil et al. |
| 2004/0061514 A1 | 4/2004 | Schwindt et al. |
| 2004/0095145 A1 | 5/2004 | Boudiaf et al. |
| 2004/0100276 A1 | 5/2004 | Fanton |
| 2004/0113639 A1 | 6/2004 | Dunklee et al. |
| 2004/0162689 A1 | 8/2004 | Jamneala et al. |
| 2004/0193382 A1 | 9/2004 | Adarnian et al. |
| 2004/0199350 A1 | 10/2004 | Blackham et al. |
| 2004/0207424 A1 | 10/2004 | Hollman |
| 2004/0251922 A1 | 12/2004 | Martens et al. |
| 2005/0024069 A1 | 2/2005 | Hayden et al. |
| 2005/0099192 A1 | 5/2005 | Dunklee et al. |
| 2005/0227503 A1 | 10/2005 | Reitinger |
| 2006/0114012 A1 | 6/2006 | Reitinger |
| 2006/0158207 A1 | 7/2006 | Reitinger |

FOREIGN PATENT DOCUMENTS

| | | |
|---|---|---|
| DE | 31 14 466 | 3/1982 |
| DE | 31 25 552 | 11/1982 |
| DE | 41 09 908 | 10/1992 |
| DE | 43 16 111 | 11/1994 |
| DE | 195 41 334 | 9/1996 |
| DE | 196 16 212 | 10/1996 |
| DE | 196 18 717 | 1/1998 |
| EP | 0 087 497 | 9/1983 |
| EP | 0 201 205 | 12/1986 |
| EP | 0 314 481 | 5/1989 |
| EP | 0 333 521 | 9/1989 |
| EP | 0 460 911 | 12/1991 |
| EP | 0 574 149 A1 | 5/1993 |
| EP | 0 574 149 | 12/1993 |
| EP | 0 706 210 | 4/1996 |
| EP | 0 505 981 | 6/1998 |
| EP | 0 573 183 | 1/1999 |
| GB | 2 197 081 | 5/1988 |
| JP | 53-052354 | 5/1978 |
| JP | 56-007439 | 1/1981 |
| JP | 62-011243 | 1/1987 |
| JP | 63-143814 | 6/1988 |
| JP | 1-165968 | 6/1989 |
| JP | 1-178872 | 7/1989 |
| JP | 1-209380 | 8/1989 |
| JP | 1-214038 | 8/1989 |
| JP | 1-219575 | 9/1989 |
| JP | 1-296167 | 11/1989 |
| JP | 2-22837 | 1/1990 |
| JP | 2-22873 | 1/1990 |
| JP | 3-175367 | 7/1991 |
| JP | 4-732 | 1/1992 |
| JP | 5-157790 | 6/1993 |
| JP | 5-166893 | 7/1993 |
| JP | 60-71425 | 3/1994 |
| JP | 7005078 | 1/1995 |
| JP | 10-116866 | 5/1998 |
| JP | 11-031724 | 2/1999 |
| JP | 2001-189285 | 7/2001 |
| JP | 2001-189378 | 7/2001 |
| JP | 2002033374 | 1/2002 |
| JP | 2002-164396 | 6/2002 |
| JP | 2002/164396 | 6/2002 |
| WO | WO 80/00101 | 1/1980 |
| WO | WO 86/07493 | 12/1986 |
| WO | WO 89/04001 | 5/1989 |
| WO | WO 01/69656 | 9/2001 |

WO  WO 2004/049395  6/2004

OTHER PUBLICATIONS

John A. Modolo, Gordon Wood Anderson, Francis J. Kub, and Ingham A.G. Mack, "Wafer level high-frequency measurements of photodetector characteristics," Applied Optics, vol. 27, No. 15, Aug. 1, 1988, pp. 3059-3060.
Cascade Microtech, "Introducing the peak of analytical probe stations," MicroProbe Update, May 1990.
H.-J. Eul and B. Schiek, "Thru-Match-Reflect: One Result of a Rigorous Theory for De-Embedding and Network Analyzer Calibration," 18th European Microwave Conference '88, The International Conference Designed for the Microwave Community, Published by Microwave Exhibitions and Publishers Limited, Sep. 12-16, 1988, Stockholm, Sweden.
Cascade Microtech, "Analytical Probe Station," Summit 9000 Series, Jun. 1, 1990.
Maury Microwave Corporation, "MT950D Series, Transistor Test Fixture Software, Software Application Packs," Sep. 20, 1982.
Eric Phizicky, Philippe I.H. Bastiaens, Heng Zhu, Michael Snyder, & Stanley Fields, "Protein analysis on a proteomic scale," Nature 422, insight: review article, Mar. 13, 2003.
Brian J. Clifton, "Precision slotted-Line Impedance Measurements Using computer Simulation for Data Correction," IEEE Transactions on Instrumentation and Measurement, vol. IM-19, No. 4, Nov. 1970, pp. 358-363.
Eric Strid (Cascade Microtech), "Planar Impedance Standards and Accuracy Considerations in Vector Network Analysis," Jun. 1986, 8 pages.
Maury Microwave Corporation, "MT950 Series Transistor Test Fixture (TTF) Notice! Notice! Notice!," May 31, 1985.
Maury Microwave Corporation, MT950 Series Transistor Test Fixture (TTF), Oct. 7, 1982, 4 pages.
Design Technique, "Microstrip Microwave Test Fixture," May 1986, 2 pages.
PHOTO: Micromanipulator Probe Station 1994.
Micromanipulator Sales and Services Inc., "Test Station Accessories," Copyright 1983, 1984, 1 page.
Ruedi Aebersold & Matthias Mann, "Insight Review Articles, Mass spectrometry-based proteomics," Nature, vol. 422, Mar. 13, 2003, pp. 198-207.
Keithley Instruments, Inc. "Low-Level Measurements for Effective Low Current, Low Voltage, and High Impedance Measurements," Revised Third Edition, Printed Jun. 1984.
Hewlett Packard, "HP 4284A Precision LCR Meter Operation Manual (Including Option 001,002,006,201,202,301)," Third Edition, Dec. 1991, pp. 2-1, 6-9, 6-15.
Cletus A Hoer, "A High-Power Dual Six-Port Automatic Network Analyzer Used in Determining Biological Effects of RF and Microwave Radiation," IEEE Transactions on Microwave Theory and Techniques, vol. MTT-29, No. 12, Dec. 1981.
Cascade Microtech Technical Brief, A Guide to Better Vector Network Analyzer Calibrations for Probe-Tip Measurements, Copyright 1994, 2 pages.
TEMPTRONIC, "Guarded" Chuck Sketch, Nov. 15, 1989.
Andrej Sali, Robert Glaeser, Thomas Earnest & Wolfgang Baumeister, "From words to literature in structural proteomics," Insight: Review Article, Nature 422, pp. 216-225, Mar. 13, 2003.
Mike Tyers & Matthias Mann, "From genomics to proteomics," Insight overview, Nature vol. 422 Mar. 2003, pp. 193-197.
William Knauer, "Fixturing for Low-Current/Low-Voltage Parametric Testing," Evaluation Engineering, Nov. 1990, pp. 9-12.

J.D.Tompkins, "Evaluating High Speed AC Testers," IBM Technical Disclosure Bulletin, vol. 13, No. 7 Dec. 1970, p. 180.
Jim Fitzpatrick, "Error Models for Systems Measurement," Microwave Journal, May 1978, pp. 63-66.
Sam Hanash, "Disease proteomics," Insight Review Articles, Nature, vol. 422, Mar. 13, 2003, pp. 226-232.
Design Technique International, "Adjustable Test Fixture," Copyright 1988.
Ronald F. Bauer & Paul Penfield, Jr., "De-Embedding and Unterminating," IEEE Transactions on Microwave Theory and Techniques, vol. MTT-22, No. 3, Mar. 1974, pp. 282-288.
Cross Section—Signatone S-1240 Sketch, Advertised & Sold 1987-1988.
Yousuke Yamamoto, "A Compact Self-Shielding Prober for Accurate Measurement of On-Wafer Electron Devices," IEEE Transactions on Instrumentation and Measurement, vol. 38, No. 6, Dec. 1989, pp. 1088-1093.
R. Y. Koyama & M. G. Buehler, "Semiconductor Measurement Technology: A Wafer Chuck for Use Between—196 and 350° C," U.S. Department of Commerce, National Technical Information Service, PB-293 298, Issued Jan. 1979.
Ken Cole, "ThermoChuck Performance (Fax)," 2 pages, Mar. 10, 1995.
S. Beck & E. Tomann, "Chip Tester," IBM Technical Disclosure Bulletin, Jan. 1985.
L. L. Sohn, O. A. Saleh, G. R. Facer, A. J. Beavis, R. S. Allan, & D. A. Notterman, "Capacitance Cytometry: Measuring biological cells one by one," PNAS vol. 97, No. 20 Sep. 26, 2000, pp. 10687-10690.
Mark S. Boguski & Martin W. McIntosh, "Biomedical Informatics for proteomics," Insight: review article, Nature 422, Mar. 13, 2003, pp. 233-237.
The Micromanipulator Company, Inc., "Model 8000 Test Station," 1986, 1 page.
The Micromanipulator Company, Inc. "Model 8000 Test Station," 1988, 1 page.
Microwave Products, Microwave Journal, Sep. 1988, 1 page.
Saswata Basu & Leonard Hayden, "An SOLR Calibration for Accurate Measurement of Orthogonal On-Wafer Duts," IEEE MTT-S Digest, 1997, pp. 1335-1336, 1338.
Hewlett Packard, "HP 41428 Modular DC source/Monitor Practical Applications—High Speed DC Characterization of Semiconductor Devices form Sub pA to 1A," Nov. 1987, pp. 1-4.
Flexion Corporation, "Cryotest Station MP-3," *Cascade Microtech, Inc.* vs. *Micromanipulator Company, Inc.*, Applebay Exhibit 576, May 13, 1998, 67 pages.
Flexion Corporation, "Cryotest Station MP-3," *Cascade Microtech, Inc.* vs. *Micromanipulator Company, Inc.*, Applebay Exhibit 578, May 13, 1998, 1 page.
*Cascade Microtech, Inc.* vs. *Micromanipulator Company, Inc.*, Applebay Exhibit 572, May 13, 1998, 2 pages.
*Cascade Microtech, Inc.* vs. *Micromanipulator Company, Inc.*, Applebay Exhibits 581A, 581B, and 581C, May 13, 1998, 3 pages.
Flexion Corporation, "AP-1 Cryotest Station," Applebay Exhibit 582, May 13, 1998, 20 pages.
*Cascade Microtech, Inc.* vs. *Micromanipulator Company, Inc.*, Applebay Exhibits 577A, 577B, 577C, May 13, 1998, 3 pages.
*Cascade Microtech, Inc.* vs. *Micromanipulator Company, Inc.*, Applebay Exhibit 585, May 13, 1998, 7 pages.

* cited by examiner

PROBE STATION WITH LOW NOISE CHARACTERISTICS

CROSS-REFERENCE TO RELATED APPLICATIONS

This application is a continuation of U.S. patent application Ser. No. 10/986,639, filed Nov. 12, 2004, now U.S. Pat. No. 7,138,810 which is a continuation of U.S. patent application Ser. No. 10/666,219, filed Sep. 18, 2003, now U.S. Pat. No. 6,847,219, which claims the benefit of U.S. Provisional App. No. 60/424,986, filed Nov. 8, 2002.

BACKGROUND OF THE INVENTION

The present invention relates to probe stations which are used for probing test devices, such as integrated circuits on a wafer, and, in particular, to probe stations that are suitable for use in measuring ultra-low currents.

Probe stations are designed to measure the characteristics of electrical devices such as silicon wafers. Probe stations typically include a chuck that supports the electrical device while it is being probed by needles or contacts on a membrane situated above the chuck. In order to provide a controlled environment to probe the electrical device, many of today's probe stations surround the chuck with an environmental enclosure so that temperature, humidity, etc. may be held within predetermined limits during testing. Environmental enclosures protect the device from spurious air currents that would otherwise affect measurements, and also facilitate thermal testing of electrical devices at other-than-ambient environmental conditions. Environmental conditions within the enclosure are principally controlled by a dry air ventilation system as well as a temperature element, usually located below the chuck, that heats or cools the electrical device being tested through thermal conduction.

Many probe stations also incorporate guarding and electromagnetic interference (EMI) shielding structures within or around the environmental enclosures in order to provide an electrically quiet environment, often essential during low noise or current testing where electrical noise from external electromagnetic sources can hinder accurate measurement of the electrical device's characteristics. Guarding and EMI shielding structures are well known and discussed extensively in technical literature. See, for example, an article by William Knauer entitled "Fixturing for Low Current/Low Voltage Parametric Testing" appearing in *Evaluation Engineering*, November, 1990, pages 150-153.

Probe stations incorporating EMI shielding structures will usually at least partially surround the test signal with a guard signal that closely approximates the test signal, thus inhibiting electromagnetic current leakage from the test signal path to its immediately surrounding environment. Similarly, EMI shielding structures may include interconnecting a shield potential to the environmental enclosure surrounding much of the perimeter of the probe station. The environmental enclosure is typically connected to earth ground, instrumentation ground, or some other desired potential.

To provide guarding and shielding for systems of the type just described, existing probe stations may include a multi-stage chuck upon which the electrical device rests when being tested. The top stage of the chuck, which supports the electrical device, typically comprises a solid, electrically conductive metal plate through which the test signal may be routed. A middle stage and a bottom stage of the chuck similarly comprise solid electrically conductive plates through which a guard signal and a shield signal may be routed, respectively. In this fashion, an electrical device resting on such a multistage chuck may be both guarded and shielded from below.

FIG. 1 shows a generalized schematic of an existing probe station. A probe station 10 includes a chuck 12 that supports an electrical device 14 to be probed by a probe apparatus 16 supported by a platen 18 located above the chuck 12. The chuck is fixedly and/or rigidly interconnected with a tub enclosure 20. The enclosure 20 may be conductive and electrically connected to a guard signal, shield signal, ground signal, or floating. The tub enclosure 20 at least partially surrounds the chuck 12, and hence the electrical device 14.

Multiple electrical devices contained on a silicon wafer may be successively positioned below the probe apparatus 16 for testing by moving the combination of the tub enclosure 20 and chuck 12 laterally. A positioner 22, typically located below the tub enclosure 20, may provide vertical, lateral and/or angular adjustments of the chuck 12. Because the chuck 12 does not move laterally with respect to the tub enclosure 20, the size of the tub enclosure 20 may closely surround the chuck 12, facilitating efficient control of the environment immediately surrounding the chuck 12.

FIG. 2 shows a generalized schematic of another probe station 11. Referring to FIG. 2, where numerals common with FIG. 1 represent similar elements that perform similar functions, the probe station 11 includes the chuck 12 that supports the electrical device 14 to be probed by the probe apparatus 16 that extends through an opening in the platen 18. Rather than enclosing the chuck 12 in the tub enclosure 20, an outer shield box 24 provides sufficient space for the chuck 12 to be moved laterally by the positioner 22. Because the chuck 12 may freely move within the outer shield box 24, a suspended member 26 electrically interconnected to a guard potential may be readily positioned above the chuck 12. The suspended guard member 26 defines an opening that is aligned with the opening defined by the platen 18 so that the probe apparatus 16 may extend through the guard member 26 to probe the electrical device 14. When connected to a guard signal substantially identical to the test signal provided to the probe apparatus 16, the suspended guard member 26 provides additional guarding for low noise tests. Such a design is exemplified by EP 0 505 981 B1, incorporated by reference herein. In addition, multiple boxes insulated from one another for a single probe station have been used to attempt to reduce the noise, with the inner box connected to instrument ground and the outer box connected to earth ground.

To provide a substantially closed environment, the outer shield box 24 includes a sliding plate assembly 28 that defines a portion of the lower perimeter of the shield box 24. The sliding plate assembly 28 comprises a number of overlapping plate members. Each plate member defines a central opening 30 through which the positioner 22 may extend. Each successively higher plate member is smaller in size and also defines a smaller opening 30 through which the positioner 22 extends. As shown in FIG. 2, the sliding plate assembly 28 is included to permit lateral movement of the positioner 22, and hence the chuck 12, while maintaining a substantially closed lower perimeter for the shield box 24.

A probe card for probing the device under test of the probe station typically includes a dielectric board as a base. A plurality of probing devices are mounted in radial arrangement about an opening in the board so that the probing elements of these devices, which may, for example, comprise slender conductive needles, terminate below the opening in a pattern suitable for probing the contact sites of the test device. The probing devices are individually connected to the respective channels of a test instrument by a plurality of interconnecting lines, where the portion of each line that extends between the corresponding probing device and the outer edge of the dielectric board may comprise an interconnecting cable or a conductive trace pattern formed directly on the board. In one conventional type of setup where the test devices are integrated circuits formed on a semiconductive wafer, the probe card is mounted by means of a supporting rig or test head above the wafer, and a support beneath the wafer moves the wafer so that each device thereon is consecutively brought into contact with the needles or probing elements of the probe card.

With particular regard to probe cards that are specially adapted for use in measuring ultra-low currents (down to the femtoamp region or lower), probe card designers have been concerned with developing techniques for eliminating or at least reducing the effects of leakage currents, which are unwanted currents that can flow into a particular cable or channel from surrounding cables or channels so as to distort the current measured in that particular cable or channel. For a given potential difference between two spaced apart conductors, the amount of leakage current that will flow between them will vary depending upon the volume resistivity of the insulating material that separates the conductors, that is, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing inter-channel leakage currents is surrounding the inner core of each lead-in wire with a cylindrical "guard" conductor, which is maintained at nearly the same potential as the inner core by a feedback circuit in the output channel of the test instrument. Because the voltage potentials of the outer guard conductor and the inner conductive core are made to substantially track each other, negligible leakage current will flow across the inner dielectric that separates these conductors regardless of whether the inner dielectric is made of a low- or high-resistivity material. Although leakage current can still flow between the guard conductors of the respective cables, this is typically not a problem because these guard conductors are connected to a low impedance path to ground. By using this guarding technique, significant improvement may be realized in the low-level current measuring capability of certain probe card designs.

To further improve low-current measurement capability, probe cards have been constructed so as to minimize leakage currents between the individual probing devices which mount the probing needles or other elements. With respect to these devices, higher-resistance insulating materials have been substituted for lower-resistance materials and additional conductive surfaces have been arranged about each device in order to perform a guarding function in relation thereto. In one type of assembly, for example, each probing device is constructed using a thin blade of ceramic material, which is a material known to have a relatively high volume resistivity. An elongate conductive trace is provided on one side of the blade to form the signal line and a backplane conductive surface is provided on the other side of the blade for guarding purposes. The probing element of this device is formed by a slender conductive needle, such as of tungsten, which extends in a cantilevered manner away from the signal trace. Such devices are commercially available, for example, from Cerprobe Corporation based in Tempe, Ariz. During assembly of the probe card, the ceramic blades are edge-mounted in radial arrangement about the opening in the card so that the needles terminate within the opening in a pattern suitable for probing the test device. The conductive backplane on each blade is connected to the guard conductor of the corresponding cable and also to corresponding conductive pad or "land" adjacent the opening in the probe card. In this manner each conductive path is guarded by the backplane conductor on the opposite side of the blade and by the conductive land beneath it.

It has been found, however, that even with the use of guarded cables and ceramic probing devices of the type just described, the level of undesired background current is still not sufficiently reduced as to match the capabilities of the latest generation of commercially available test instruments, which instruments are able to monitor currents down to one femtoamp or less.

In the latest generation of probe cards, efforts have been directed toward systematically eliminating low-resistance leakage paths within the probe card and toward designing extensive and elaborate guarding structures to surround the conductors along the signal path. For example, in one newer design, the entire glass-epoxy main board is replaced with a board of ceramic material, which material, as noted above, presents a relatively high resistance to leakage currents. In this same design, the lead-in wires are replaced by conductive signal traces formed directly on the main board, which traces extend from an outer edge of the main board to respective conductive pads that surround the board opening. Each pad, in turn, is connected to the signal path of a corresponding ceramic blade. In addition, a pair of guard traces are formed on either side of each signal trace so as to further isolate each trace against leakage currents.

In yet another of these newer designs, a main board of ceramic material is used having three-active layers to provide three dimensional guarding. Above this main board and connected thereto is a four-quadrant interface board that includes further guard structures. Between these two board assemblies is a third unit including a "pogo carousel." This pogo carousel uses pogo pins to form a plurality of signal lines that interconnect the interface board and the lower main board. It will be recognized that in respect to these pogo pins, the effort to replace lower resistance insulators with higher resistance insulators has been taken to its practical limit, that is, the insulator that would normally surround the inner conductor has been removed altogether.

From the foregoing examples, it will be seen that a basic concern in the art has been the suppression of inter-channel leakage currents. Using these newer designs, it is possible to measure currents down to nearly the femtoamp level. However, the ceramic material used in these newer designs is relatively more expensive than the glass-epoxy material it replaces. Another problem with ceramic materials is that they are relatively susceptible to the absorption of surface contaminants such as can be deposited by the skin during handling of the probe card. These contaminants can decrease the surface resistivity of the ceramic material to a sufficient extent as to produce a substantial increase in leakage current levels. In addition, the more extensive and elaborate guarding structures that are used in these newer designs has contributed to a large increase in design and assembly costs. Based on these developments it may be anticipated that only gradual improvements in the low-current measurement capability of the cards is likely to come about, which improvements, for example, will result from increasingly more elaborate guarding systems or from further research in the area of high resistance insulative materials.

In addition to suppressing leakage currents that flow between the different signal channels, low noise cables that reduce the triboelectric effect have been used on a probe card. In a guarded coaxial cable, triboelectric currents can arise between the guard conductor and the inner dielectric due to friction there between which causes free electrons to rub off the conductor and creates a charge buildup resulting in current flow.

It should also be noted that there are other factors unrelated to design that can influence whether or not the potential of a particular probe card for measuring low-level currents will be fully realized. For example, unless special care is taken in assembling the probe card, it is possible for surface contaminants, such as oils and salts from the skin or residues left by solder flux, to contaminate the surface of the card and to degrade its performance (due to their ionic character, such contaminants can produce undesirable electrochemical effects). Furthermore, even assuming that the card is designed and assembled properly, the card may not be suitably connected to the test instrument or the instrument may not be properly calibrated so as to completely null out, for example, the effects of voltage and current offsets. In addition, the probe card or the interconnecting lines, can serve as pickup sites for ac (alternating current) fields, which ac fields can be rectified by the input circuit of the test instrument so as to cause errors in the indicated dc values. Thus, it is necessary to employ proper shielding procedures in respect to the probe card, the interconnecting lines and the test instrument in order to shield out these field disturbances. Due to these factors and others, when a new probe card design is being tested, it can be extremely difficult to isolate the causes of undesirable background current in the new design due to the numerous and possibly interacting factors that may be responsible.

A chuck typically includes an upper conductive surface in contact with the device under test. One or more additional layers are typically included below the upper conductive surface while being electrically isolated from one another. In this manner, the upper conductive surface may be electrically connected to the signal path, while the remaining layers may be electrically connected to the guard potential and shield potential, if desired. In addition, the chuck may be surrounded laterally with a conductive ring that may likewise be electrically connected to a guard or shield potential. In this manner, the device under test is guarded from below and to the side in order to reduce the electrical noise and leakage current that exists in the measurement of devices. Also, a plate may be suspended above the chuck (normally with an opening therein) and electrically interconnected to a guard or shield potential.

While such guarding and shielding reduces the amount of noise in the signal path, designers of such chucks must consider numerous other factors that influence the measurement. For example, thermal chucks (i.e., chucks that provide a range of temperatures) typically include heater circuits which emanate electrical signals into the region of the device under test, and hence the signal path. In addition, thermal chucks may include fluid paths, such as tubular cavities, within the chuck that carry hot or cold fluids that likewise result in noise in the signal path. Furthermore, thermal chucks are constructed of a variety of different materials, such as different conductive materials and different dielectric materials, all of which expand and contract at different rates further exasperating the potential of undesired noise in the test signal. Moreover, different temperatures change the relative humidity in the probe station, which in turn, change the amount of moisture absorbed by the dielectric materials, which in turn, change the impedance of the materials therein, and thus may result in variable leakage currents in the test signal.

With respect to thermal and non-thermal chucks there may be ground currents from the chuck to the test instrument that impact the sensed current in the signal path. During the probing of different parts of the device under test, the capacitive coupling (and magnetic coupling) of different portions of the chuck, and the capacitive coupling (and magnetic coupling) of the chuck relative to the enclosure changes, thereby inducing voltage changes. Furthermore, vibrations of the probe station itself, and thus the chuck located therein, as a result of testing, as a result of the external environment, and as a result of the air flowing within the probe station likewise induces undesirable leakage currents and noise in the signal path.

As it may be observed, due to these and other factors, when a new chuck design is being tested, it can be extremely difficult to isolate the causes of undesirable background current in the new design due to the numerous and possibly interacting factors that may be responsible.

To interconnect the chuck to the test instrumentation a service loop is normally used. The service loop is a flexible support that maintains all the hoses, the power cables, the signal cables, the instrumentation cables, and the sensor wiring, in a compact manner adjacent to one another while the chuck moves within the enclosure. The vibrations of the probe station, the vibrations from air blowing across the cables, the vibrations of the cables after moving the chuck, the vibrations from stepper motors connected to the chuck, the vibrations from flowing coolant in the hoses of the service loops, etc., all potentially results in undesirable currents in the signal path. In addition, magnetic and capacitive coupling between the power and ground conductors to the signal conductor likewise results in undesirable currents in the signal path. Further, the service loop itself is normally constructed of metal or otherwise includes metal bands, which likewise radiates electromagnetic signals that may result in undesirable currents in the signal path. All of these design considerations are in addition to considerations regarding the selection of construction materials and assembly considerations similar to those of probe cards.

As it may be observed, due to these factors, when a service loop design is being tested, it can be extremely difficult to isolate the causes of undesirable background current in the new design due to the numerous and possibly interacting factors that may be responsible.

The enclosure for the chuck, the service loop, the probe card, and the device under test likewise also includes potential sources of undesirable currents in the signal path. As an initial matter, the lid of the enclosure may have vibrational mechanical motion which results in a change in capacitance between the lid and the chuck, and a probe supported by the lid and the chuck, thus causing some undesirable currents in the signal path, in accordance with movement of the lid. In addition, there may be electrical surface charges on interior surfaces of the probe station, and other components contained therein, which also result in potentially undesirable currents in the signal path. Other structures within the enclosure can likewise result in undesirable currents in the signal path, such as for example, sliding plates below the chuck, conductive coated baffles below the chuck, air flow within the enclosure, motors for moving the chuck, position sensors, sensor wires, and dew meters. Furthermore, during testing of the device under test the probes themselves introduce external radiating signals into the probing environment in the vicinity of the device under test. All of these design considerations are in addition to considerations regarding the selection of construction materials and assembly considerations similar to those of probe cards.

In addition to those items contained within the enclosure of the probe station, there are additional sources of potential noise in the signal path located near the enclosure. The stage motors may be located adjacent the enclosure, power supplies may be adjacent the enclosure, stepper motor drivers may be located adjacent to the enclosure, personal computers may be located adjacent to the enclosure, computer monitors may be located adjacent to the enclosure, 60 hertz power sources may be located adjacent to the enclosure, etc., all of which may result in undesirable noise.

As it may be observed, due to these and other factors, when a probe station itself is being tested, it can be extremely difficult to isolate the causes of undesirable background current in the new design due to the numerous and possibly interacting factors that may be responsible.

As it may be observed, due to interrelated factors related to the chuck, the probing device, the probe card, the service loop, and other aspects of the probe station, when the entire probe station itself is being tested, it can be extremely difficult to isolate the causes of undesirable background current in the new design due to the numerous and possibly interacting factors that may be responsible. Accordingly, with each design and with increasingly lower noise requirements, it is exceedingly difficult to determine the primary source of the noise in the signal path.

The foregoing and other objectives, features, and advantages of the invention will be more readily understood upon consideration of the following detailed description of the invention, taken in conjunction with the accompanying drawings.

DETAILED DESCRIPTION OF PREFERRED EMBODIMENT

During the assembly process of probe stations many different aspects related to noise levels of the signals are measured. One of the tests that is performed on the tri-axial cabling is to measure the bulk resistance layer to layer, such as signal to guard and guard to shield. Another test that is performed on the tri-axial cabling is to provide a known voltage, such as 0 volts to 10 volts, and measure any current variations between the signal conductor (force path) and the guard conductor.

Figure 1:
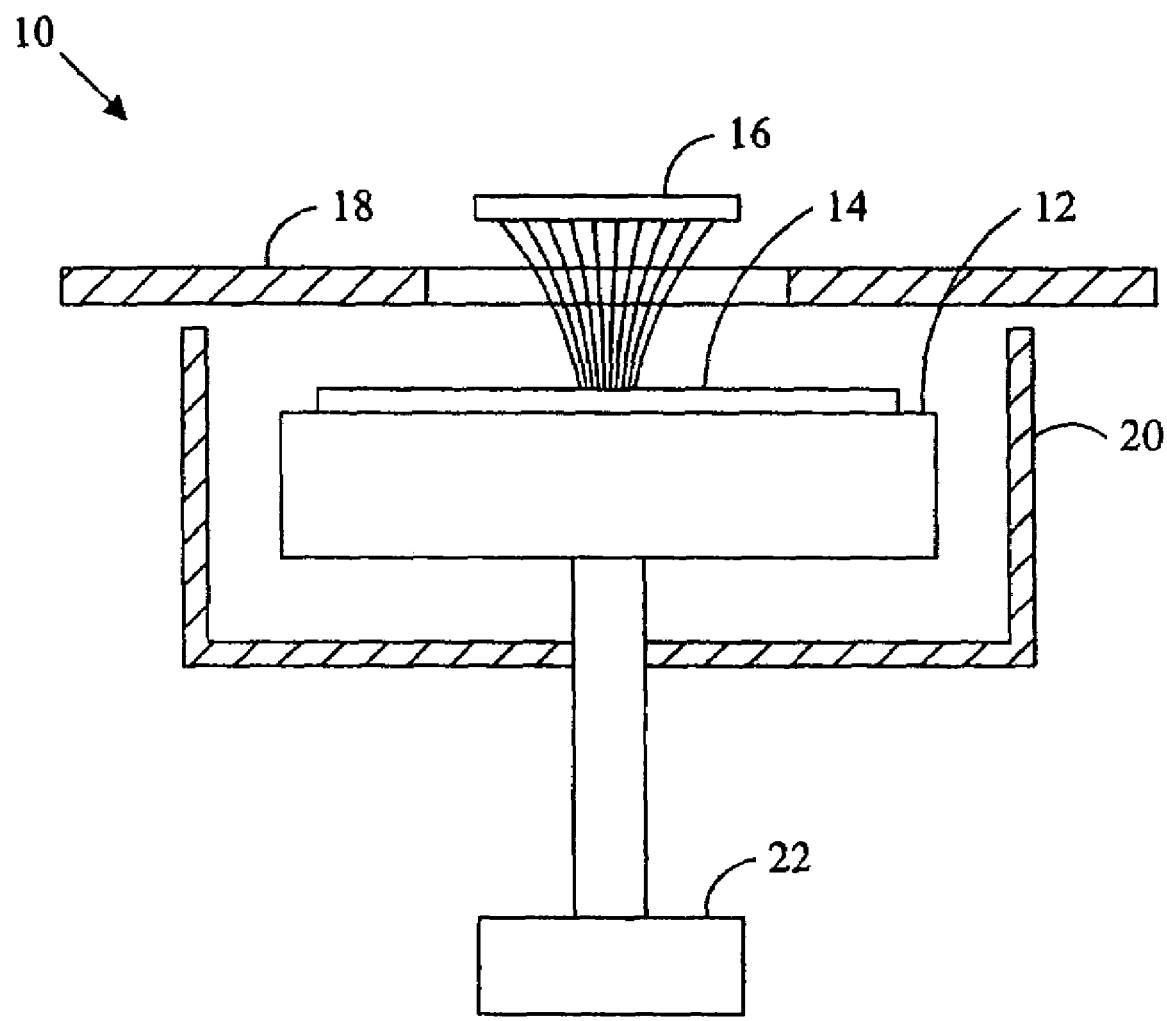
FIG. 1 illustrates an existing probe station
Figure 2:
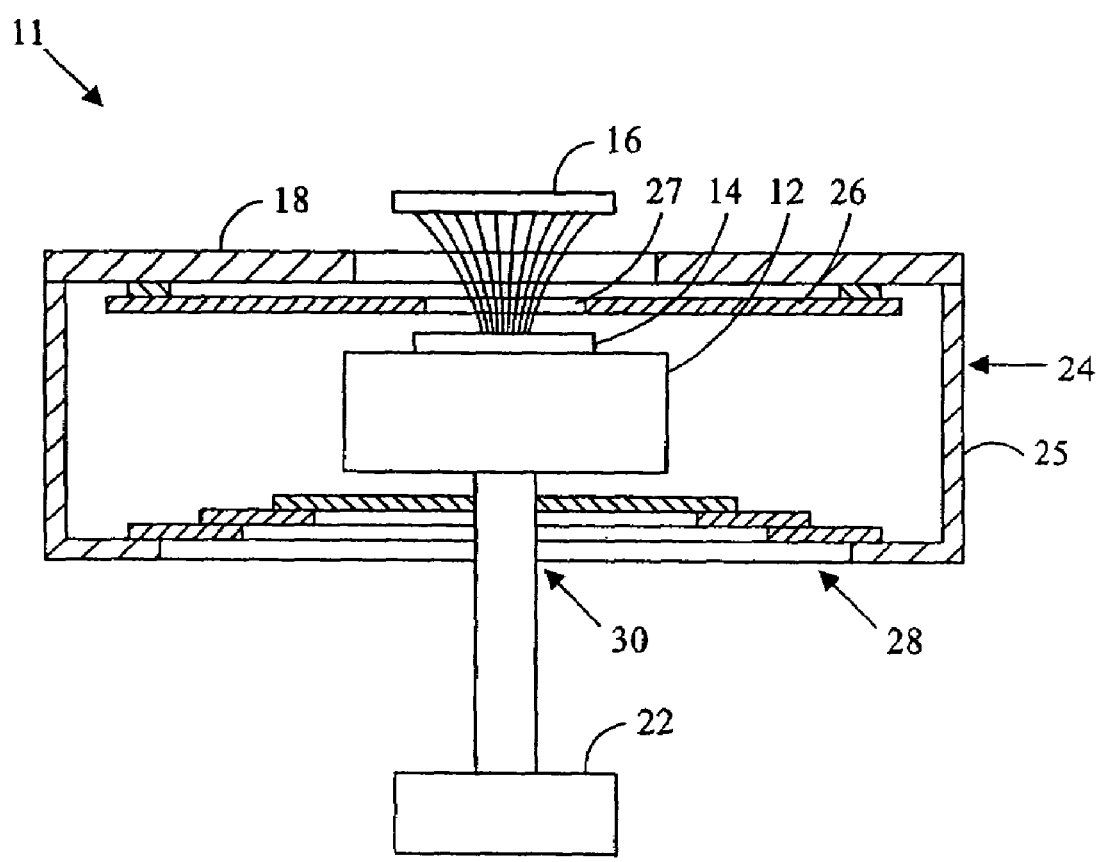
FIG. 2 illustrates another existing probe station
Figure 3:
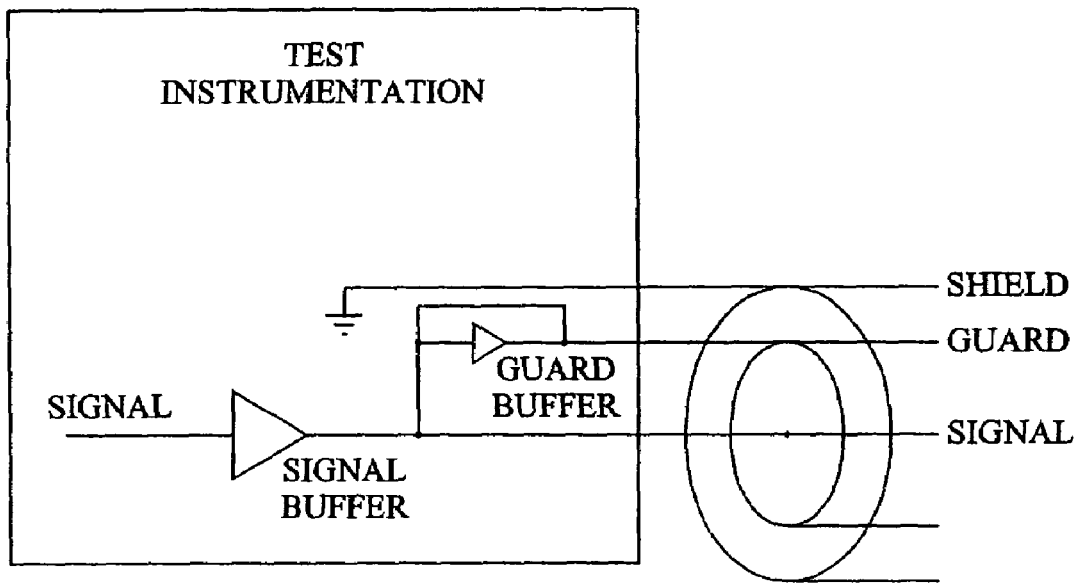
FIG. 3 illustrates a test instrument and associated buffers for a cable.

Referring to FIG. 3, the test instrumentation normally includes a signal buffer to drive the signal line. A guard unity gain amplifier connected to the output of the signal buffer provides a high impedance path between the signal and the guard together with imposing a signal on the guard conductor that tracks the signal on the signal conductor. While having the potential on the guard conductor exactly track the potential on the signal conductor is ideal, in actual test instrumentation there is a small delta voltage potential between the signal and guard while performing measurements. The potential on the guard conductor increases the effective leakage resistance between the signal conductor and shield conductor. For example, if the delta voltage was 0.10% difference then the leakage resistance between the signal conductor and the shield conductor would be approximately 1,000 times greater than it otherwise would have been. In effect the leakage resistance between signal and shield is increased 1,000 times, thus decreasing leakage currents. Similarly, the capacitance between the signal and shield is decreased by 1,000 times in comparison to not having a guard conductor.

When testing indicates leakage current problems with any particular tri-axial cable normally the connector to the cable was improperly connected or contaminants in the assembly process occurred. In addition, over time it is believed that the tri-axial cables deteriorate from contaminants from the insulation wrapped around the conductors, including for example, flux and tinning (tin oxide flaking).

Normally the shield material, which it is speculated by the present inventors may result in tinning, is a braided mesh material constructed of thin wires. To reduce the likelihood of tinning the present inventors considered the coverage provided by the shield and determined that a 10-15% gap exists between the wires. After consideration of this previously unconsidered gap in the shield material, the present inventors thought that by reducing the aperture between the wires that this would decrease the likelihood that electromagnetic waves exterior to the cable itself would be able to penetrate between the wires to the guard layer underneath. In addition, the mesh of small long wires tend to have a significant resistance, such as 1 ohm or more. To reduce the resistance of the braid the present inventors further considered using thicker gage wires, which would likely result in large openings that is counter to the goal of decreasing the opening side, or otherwise using one or more large wires to act as low resistance paths, while would likely result in a significantly more expensive cable. In addition, the present inventors considered increasing the distance between the guard and shield conductors to decrease any potential capacitive coupling. To reduce the likelihood that signals will pass through the openings in the mesh, the present inventors added an additional layer of conductive material between the shield material and the adjacent dielectric layer which covers in excess of 95% of the dielectric layer, and covers substantially 100% in combination with the shield material, in profile.

To test the new cable design, the present inventors put the cable in a metal cylinder and imposed a strong radio frequency signal onto the conductive cylinder while measuring any induced noise on the signal conductor. The measurement of the noise levels involves connecting the cable to the test instrumentation and positioning the cable in a desirable location. It would be expected that the noise level would decrease significantly as a result of the additional conductive material, but in utter surprise to the present inventors the noise level in fact did not noticeably change, apart from a decrease in the capacitive coupling because of the increased distance between the shield conductor and the signal conductor. Accordingly, it was initially considered that modification of the cable to include an additional conductive layer adjacent the shield to reduce the potential for electromagnetic signals to pass through was of no perceived value.

While conducting such noise tests the present inventors observed a phenomena not commonly associated with such measurement characteristics, namely, that the settling time of the current signals within the modified cables were reduced in comparison to non-modified cables. In addition, the settling time of the cables is not normally a characterized parameter of the cable so accordingly noticing the difference required an astute, and generally overlooked, observation on the part of the present inventors. Based upon these realizations, the present inventors constructed a further test that involved comparing whether the modified cables were less sensitive to table (surface) vibrations than non-modified cables. The present inventors were surprised to determine that in fact the noise level in the modified cables when laid on the table outside of the conductive tubular member were in fact less than the non-modified cables. After coming to this rather unexpected realization, the present inventors then reconsidered the structure of the modified cables and came to the realization that the vibrational motion of the table, albeit rather small, was a source of the noise levels observed in the cables. With this realization of vibrational motion in the tri-axial cables being identified as a principal source of noise, the present inventors then realized that non-negligible triboelectric currents were in fact being generated between the shield conductive layer and the adjacent dielectric layer, and thereafter impacting signal integrity within the signal conductor.

This unlikely source of noise generation came as an utter astonishment to the present inventors because the guard buffer amplifier within the test instrumentation is driving the potential of the guard conductor to that of the signal conductor, and thus presumably counteracting any external influences. However, apparently the guard amplifier in the test instrumentation has non-ideal characteristics such that small external changes are not effectively eliminated, or otherwise the guard conductor does not have ideal characteristics. In any event, even in a shielded environment it was determined that a significant source of noise is charge that builds up on the layers between the guard conductor and the shield conductor, principally as a result of relative movement of these layers. The capacitive charge buildup, typically referred to as triboelectric currents, couples from the layer or layers external to the guard conductor to the signal conductor, and are observed as noise.

For example, a test of the decay of such triboelectric currents for the non-modified cables illustrates a decay time of approximately 15-30 seconds to 10% of its initial value. In contrast, a test of the decay of such triboelectric currents for the modified cables exhibits a decay time of approximately 1-5 seconds to 10% of its initial value. One way, albeit not the only way or a necessary characteristic, to characterize the difference is that the modified cable has a settling time of at least three times as fast as the non-modified cable.

The low-noise cables include conductive and dielectric layers in coaxial arrangement with each other and further include at least one layer of material between the guard and the shield within each cable adapted for suppressing the triboelectric effect so as to minimize any undesirable currents that would otherwise be generated internally in each cable due to this effect. This layer of material together with certain other structures included in the probe station enables probing using ultra-low currents of less than one femtoamp.

Figure 4:
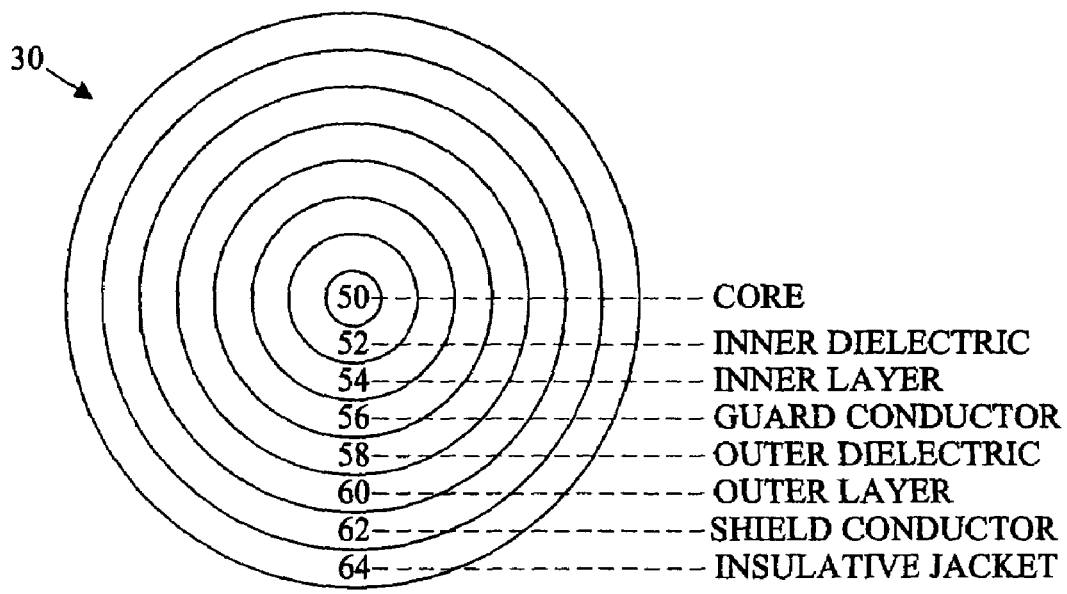
FIG. 4 illustrates a tri-axial cable.

FIG. 4 shows a transverse sectional view through an exemplary cable 30. This portion, which is of tri-axial construction, includes an inner conductor or core 50, an inner dielectric 52, an inner layer 54, a guard conductor 56, an outer dielectric 58, an outer layer 60, a shield conductor 62, and an insulative jacket 64. The inner layer 54, and outer layer 60 are of suitable composition for reducing triboelectric current generation between the inner dielectric 52 and the guard conductor 56, and the outer dielectric 58, and the shield conductor 62, respectively, to less than that which would occur were the inner dielectric 52 and the guard conductor 56, and the outer dielectric 58, and the shield conductor 62, respectively, to directly adjoin each other. The inner layer 54 and outer layer 60 should have physical properties similar to that of the inner dielectric 52 so that it does not rub excessively against the inner dielectric 52 and outer dielectric 58, respectively, despite cable flexing or temperature changes. At the same time, the inner layer 54 and outer layer 60 should have sufficient conductive properties to dissipate any charge imbalances that may arise due to any free electrons that have rubbed off the guard conductor 56 or shield conductor 62, respectively. A suitable material for this purpose is a fluoropolymer such as TEFLON (™) or other insulative material such as polyvinylchloride or polyethylene in combination with graphite or other sufficiently conductive additive. In addition, a sputtering technique may be used to apply a suitable triboelectric noise reducing layer. Also, the shield and guard conductors may be impregnated in some manner with triboelectric reducing material.

Figure 5:
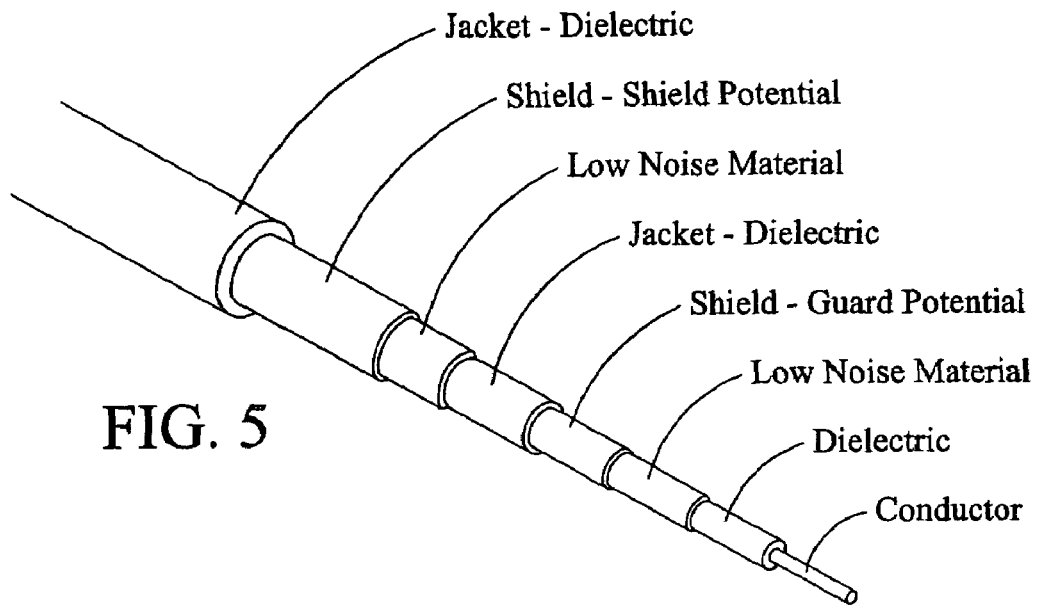
FIG. 5 illustrates the tri-axial cable of FIG. 4.
Figure 6:
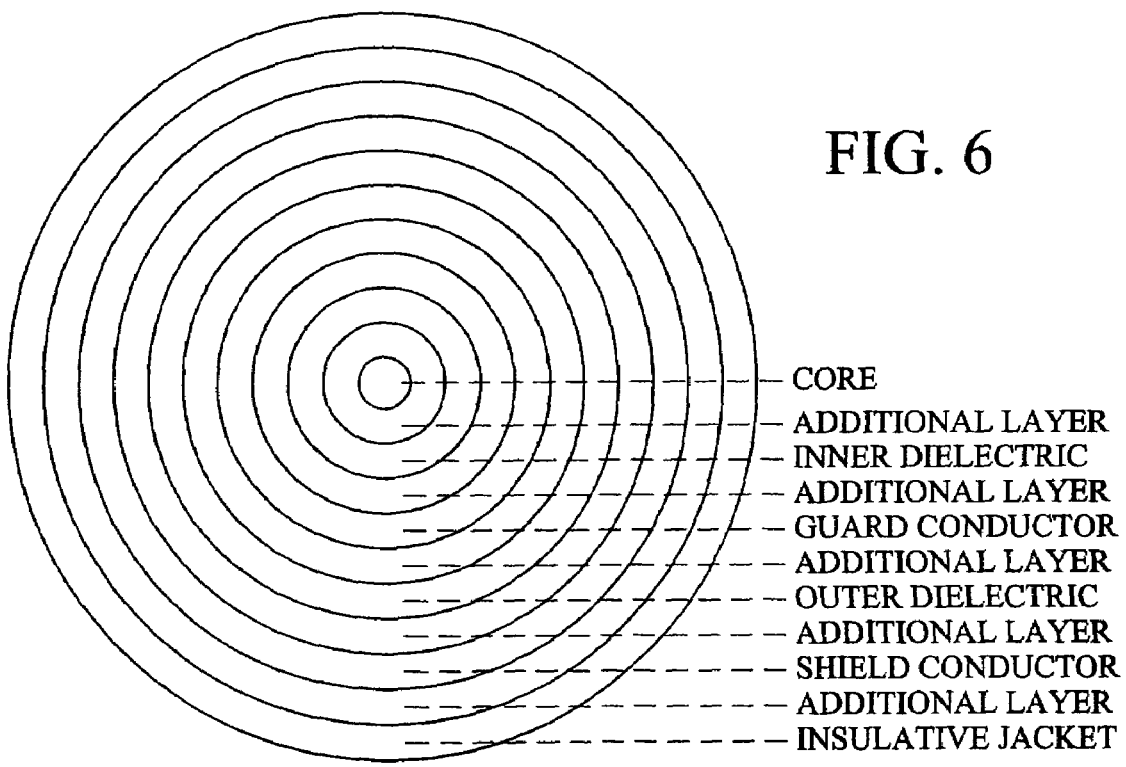
FIG. 6 illustrates another tri-axial cable.

An exemplary cable is illustrated in FIG. 5. It is to be understood that additional layers may likewise be included with the cable. Another exemplary cable is illustrated in FIG. 6, that includes additional layers of triboelectric reducing materials, where any one or more of the triboelectric reducing layers may be included.

It is to be understood that the inner layer 54 may be omitted, if desired. In addition it is to be understood that the cable described herein, with the outer layer, or the combination of the outer layer and the inner layer, may be used for other applications apart from probe stations. For example, such cables may be suitable for medical devices.

In accordance with the previous discussion, the present inventors have discovered that the primary problem, at least at some stage in the design, is not how best to suppress the leakage currents that flow between the different signal channels but rather how best to suppress those currents that internally arise in each cable or signal channel as a result of the triboelectric effect. In a tri-axial cable, triboelectric currents can arise between the shield conductor and the outer dielectric due to friction there between which causes free electrons to rub off the conductor and creates a charge imbalance that causes current to flow. Such triboelectric currents are likewise generated at other interfaces. Once the inventor recognized that this triboelectric effect might be the critical problem, he proceeded to test this insight by testing such "low-noise" cables.

It will be noted that the present inventors do not claim to have discovered a new solution to the problem of the triboelectric effect. A relatively straightforward solution to this problem can be found in the field of cable technology wherein it is known how to construct a "low-noise" cable by using an additional layer of material between a guard conductor and an inner dielectric, which material is of suitable composition for suppressing the triboelectric effect. This layer, in particular, includes a nonmetallic portion that is physically compatible with the inner dielectric so as to be prevented from rubbing excessively against this dielectric and, on the other hand, includes a portion that is sufficiently conductive that it will immediately dissipate any charge imbalance that may be created by free electrons that have rubbed off the outer conductor. It is not claimed by the present inventors that this particular solution to the triboelectric effect problem is his invention. Rather it is the recognition that this specific problem is a major source of performance degradation in the field of low-current design and the recognition of the interfaces where such currents may originate.

In retrospect, one can speculate as to why the significance of the triboelectric effect was not recognized sooner by investigators in the art of probe station design. One possible reason is that verifying the importance of this effect is not merely a matter of replacing cables with low-noise cables. Because of the non-design related factors specified in the background section, one of ordinary skill who assembled and then tested a probe station that included tri-axial low-noise cables would not necessarily detect the superior capability of this cable for low current measurements. For example, surface contaminants deposited during assembly might raise the background level of current to a sufficient extent that the effect of the low-noise cables is concealed. To this it may be added that the direction taken in the art of probe station design, where the focus has been on the problem of suppressing inter-channel leakage currents.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probe station for probing a device under test comprising:
    (a) a support for holding said device under test;
    (b) a probing device for testing said device under test while being supported by said support;
    (c) a cable connecting said probing device to a test instrument, said cable including:
        (i) a first conductor, a first dielectric, and a second conductor, where said first dielectric is between said first conductor and said second conductor;
        (ii) a second dielectric, and a third conductor, where said second dielectric is between said second conductor and said third conductor;
        (iii) further including a first layer of material between said second conductor and said third conductor, said first layer of material reducing triboelectric current from said second dielectric to less than that which would occur were said second dielectric to directly adjoin both said second and third conductors.

2. The probe station of claim 1 further comprising a second layer of material between said first conductor and said second conductor, said first layer of material reducing triboelectric current from said first dielectric to less than that which would occur were said first dielectric to directly adjoin said first and second conductors.

3. A probe station for probing a device under test comprising:
    (a) a support for holding said device under test;
    (b) a probing device for testing said device under test while being supported by said support;
    (c) a cable connecting said probing device to a test instrument, said cable including:
        (i) a first conductor, a first dielectric, and a second conductor, where said first dielectric is between said first conductor and said second conductor;
        (ii) a second dielectric, and a third conductor, where said second dielectric is between said second conductor and said third conductor;
        (iii) further including a first layer of material between said second conductor and said first conductor, said first layer of material reducing triboelectric current from said first dielectric to less than that which would occur were said first dielectric to directly adjoin both said first and second conductors.

4. The probe station of claim 3 further comprising a second layer of material between said second conductor and said third conductors, said second layer of material reducing triboelectric current from said second dielectric to less than that which would occur were said second dielectric to directly adjoin both said second and third conductors.

5. A cable comprising:
    (a) a first conductor, a first dielectric, and a second conductor, where said first dielectric is between said first conductor and said second conductor;
    (b) a second dielectric, and a third conductor, where said second dielectric is between said second conductor and said third conductor;
    (c) further including a first layer of material between said second conductor and said third conductor, said first layer of material reducing triboelectric current said second dielectric to less than that which would occur were said second dielectric to directly adjoin said second and third conductors.

6. The cable of claim 5 further comprising a second layer of material between said first conductor and said second conductor, said first layer of material for reducing triboelectric current from said first dielectric to less than that which would occur were said first dielectric to directly adjoin both said first and second conductors.

7. A cable comprising:
    (a) a first conductor, a first dielectric, and a second conductor, where said first dielectric is between said first conductor and said second conductor;
    (b) a second dielectric, and a third conductor, where said second dielectric is between said second conductor and said third conductor;
    (c) further including a first layer of material between said second conductor and said first conductor, said first layer of material reducing triboelectric current from said first dielectric to less than that which would occur were said first dielectric to directly adjoin both said first and second conductors.

8. The probe station of claim 7 further comprising a second layer of material between said third conductor and said second conductor, said second layer of material reducing triboelectric current from said second dielectric to less than that which would occur were said second dielectric to directly adjoin said second and third conductors.

* * * * *